US012765275B2

(12) United States Patent
Chiang et al.

(10) Patent No.: US 12,765,275 B2
(45) **Date of Patent: *Oct. 13, 2026**

(54) MEMORY DEVICE, MEMORY ARRAY, AND MEMORY UNIT

(71) Applicant: Taiwan Semiconductor Manufacturing Company, Ltd., Hsinchu (TW)

(72) Inventors: Hung-Li Chiang, Taipei City (TW); Jer-Fu Wang, Taipei City (TW); Tzu-Chiang Chen, Hsinchu City (TW); Meng-Fan Chang, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 181 days.

This patent is subject to a terminal disclaimer.

(21) Appl. No.: 18/764,340

(22) Filed: Jul. 4, 2024

(65) Prior Publication Data

US 2024/0365689 A1 Oct. 31, 2024

Related U.S. Application Data

(63) Continuation of application No. 17/672,695, filed on Feb. 16, 2022, now Pat. No. 12,069,970.

(51) Int. Cl.

*G11C 13/00* (2006.01)
*H10N 70/00* (2023.01)
*H10N 70/20* (2023.01)

(52) U.S. Cl.

CPC ....... *H10N 70/231* (2023.02); *G11C 13/0004* (2013.01); *H10N 70/8828* (2023.02)

(58) Field of Classification Search

CPC .............. G11C 13/0004; G11C 13/003; G11C 2013/0071; G11C 2013/0078; G11C 11/56; G11C 2013/0092; G11C 2213/15; G11C 2213/79; G11C 11/5678; G11C 13/004; G11C 13/0069; H10N 70/231; H10N 70/8828

See application file for complete search history.

(56) References Cited

U.S. PATENT DOCUMENTS 7,366,013 B2 * 4/2008 Roohparvar ........ G11C 11/5628 365/185.11
7,596,022 B2 * 9/2009 Chae ................... G11C 11/5628 365/185.18
2008/0074928 A1 * 3/2008 Choi ................... G11C 11/5628 365/185.17
2008/0285352 A1 * 11/2008 Cho .................... G11C 11/5642 365/185.18
2009/0059662 A1 * 3/2009 Woo ........................ G11C 16/10 365/185.18
2014/0059406 A1 * 2/2014 Hyun .................. G11C 11/5642 714/773
2015/0302923 A1 * 10/2015 Siau ................... G11C 13/0007 365/148

(Continued)

*Primary Examiner* — Khamdan N. Alrobaie
(74) *Attorney, Agent, or Firm* — JCIPRNET

(57) ABSTRACT

The disclosure provides a memory device, a memory array, and an N-bit memory unit. The memory device includes a memory array including an N-bit memory unit, wherein N is a positive integer. The N-bit memory unit includes a first memory cell, used to characterize at least two first bits of a plurality of least significant bits of the N-bit memory unit.

20 Claims, 6 Drawing Sheets

(56) References Cited

U.S. PATENT DOCUMENTS

| | | | | |
|---|---|---|---|---|
| 2019/0080752 | A1* | 3/2019 | Hwang | G11C 11/5671 |
| 2024/0282349 | A1* | 8/2024 | Wen | G06F 7/5443 |
| 2024/0304255 | A1* | 9/2024 | Castro | G11C 13/004 |

* cited by examiner

MEMORY DEVICE, MEMORY ARRAY, AND MEMORY UNIT

CROSS-REFERENCE TO RELATED APPLICATION

This application is a continuation application of and claims the priority benefit of a prior application Ser. No. 17/672,695 filed on Feb. 16, 2022. The entirety of the above-mentioned patent application is hereby incorporated by reference herein and made a part of this specification.

BACKGROUND

1. Field of the Invention

The disclosure generally relates to a memory structure, in particular, to a memory device, a memory array, and an N-bit memory unit.

2. Description of Related Art

In a conventional memory array, all bits in a word of the memory array are achieved by a single level cell (SLC) structure or a multi-level cell (MLC) structure. In this case, N bits in a word are implemented by N SLCs or at least one MLC. That is, the SLC structure and MLC structure would not be implemented in the same word.

However, the density and/or the accuracy of the conventional memory array may be degraded in the above ways.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
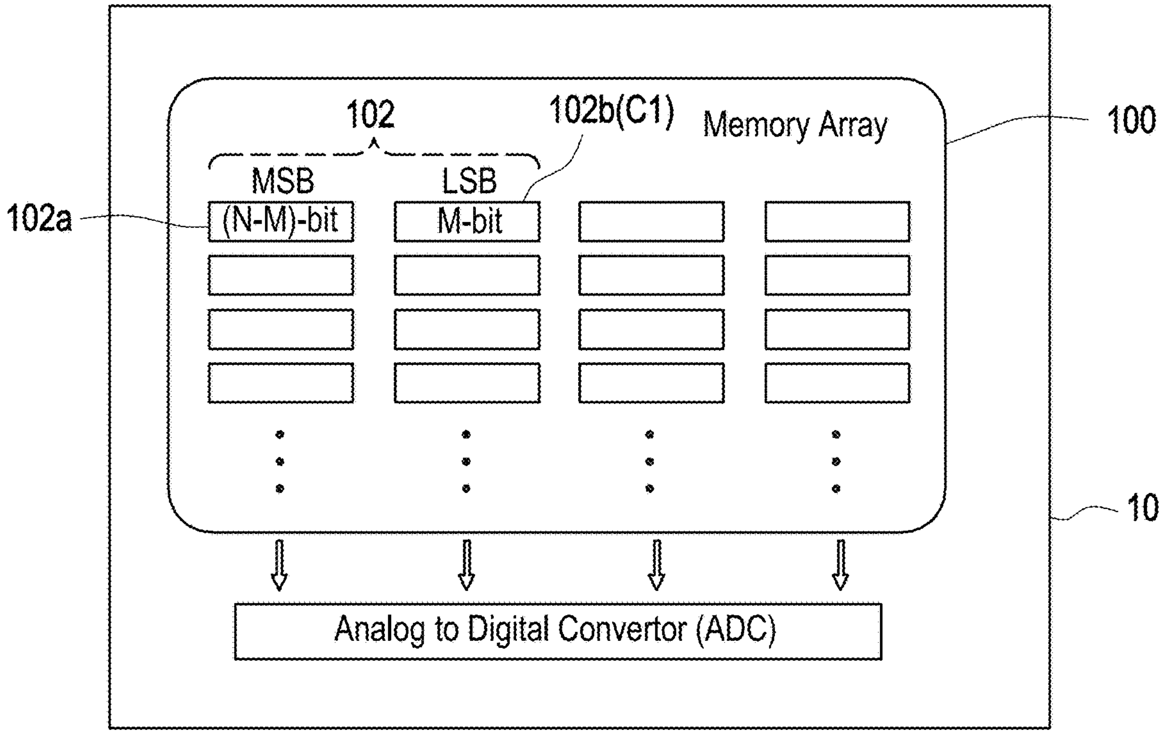
FIG. 1 shows a schematic diagram of a memory device according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

See FIG. 1, which shows a schematic diagram of a memory device according to an embodiment of the disclosure. In FIG. 1, the memory device 10 at least includes a memory array 100 and an analog to digital converter (ADC). In the embodiments of the disclosure, the memory array 100 includes at least one memory unit (e.g., the N-bit memory unit 102).

In the following discussions, the N-bit memory unit 102 would be used as an example for explanation, but the disclosure is not limited thereto. For other memory units (e.g., other words in the memory array 100), the details thereof can be correspondingly understood based on the following discussions.

In one embodiment, the N-bit memory unit 102 can be a word in the memory array 100. In one embodiment, the N-bit memory unit 102 includes a most significant bit (MSB) part 102*a* and a least significant bit (LSB) part 102*b*, wherein the MSB part 102*a* can include one or more MSBs, and the LSB part 102*b* can include several LSBs.

In FIG. 1, the LSB part 102*b* is assumed to include M (LSB) bits, and the M bits (referred to as first bits) are characterized by a first memory cell C1. In the embodiments of the disclosure, M is an integer between 2 and N, and N is an integer and the length of the N-bit memory unit 102.

In a first embodiment, the first memory cell C1 is a first phase change memory (PCM) cell, and a material of the first PCM cell is GST (Ge2Sb2Te5) with a specific percentage of Nitrogen doping. In one embodiment, the specific percentage ranges between 7% to 20%. In another embodiment, the specific percentage ranges between 12% to 15%, but the disclosure is not limited thereto.

In a second embodiment, the first memory cell C1 can be implemented as a resistive random access memory (RRAM) cell, but the disclosure is not limited thereto.

In a variation of the first embodiment, the LSB part 102*b* can further include other bits (referred to as second bits), wherein the first bits (i.e., the M bits) can be characterized by the first memory cell C1, and the second bits in the LSB part 102*b* can be characterized by a second memory cell.

In the embodiment where the first memory cell C1 is implemented as the first PCM cell, the second memory cell can be implemented as another PCM cell, and a material of the second memory cell is GST with a specific percentage of Nitrogen doping. In one embodiment, the specific percentage of Nitrogen doping of the second memory cell can be between 7% to 20% or between 12% to 15%, but the disclosure is not limited thereto.

In the embodiment where the first memory cell C1 is implemented as the RRAM cell, the second memory cell can be implemented as another RRAM cell, but the disclosure is not limited thereto.

In the embodiments of the disclosure, the N-bit memory unit 102 can include at least one third memory cell, and each of the third memory cell is used to characterize one bit of the MSBs in the MSB part 102*a* of the N-bit memory unit 102. In the scenario in FIG. 1, since the LSB part 102*b* is assumed to include M bits, the MSB part 102*a* includes (N-M) bits, which represents that the number of the third memory cell(s) in the MSB part 102*a* is (N-M), but the disclosure is not limited thereto. In one embodiment, each third memory cell is a second PCM cell, and a material of the second PCM cell is GST without Nitrogen doping.

Figure 2:
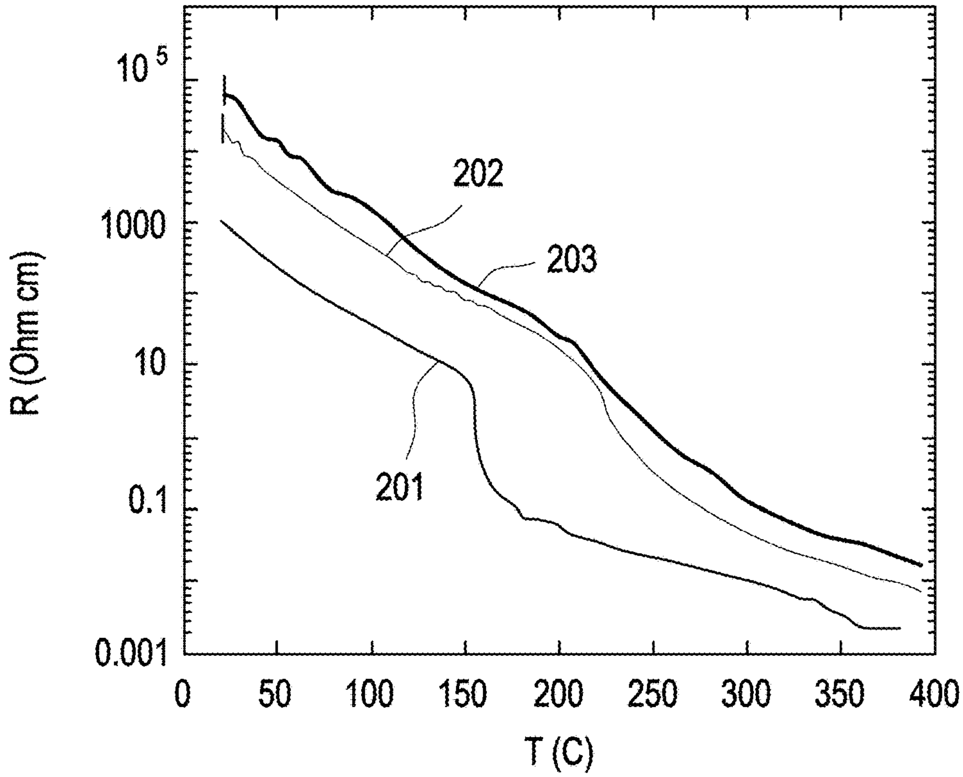
FIG. 2 shows the variation of the resistance of PCM cells with different Nitrogen doping in response to different temperatures according to an embodiment of the disclosure.

See FIG. 2, which shows the variation of the resistance of PCM cells with different Nitrogen doping in response to different temperatures according to an embodiment of the disclosure. In FIG. 2, the curve 201 corresponds to a PCM cell whose material is GST without Nitrogen doping (referred to as pure GST), the curve 202 corresponds to a PCM cell whose material is GST with 7% Nitrogen doping (referred to as NGST 7 at %), and the curve 203 corresponds to a PCM cell whose material is GST with 12% Nitrogen doping (referred to as NGST 12 at %).

As shown by the curve 201, the resistance variation of the pure GST is more non-linear than the resistance variations of the NGST 7 at % and NGST 12 at %. More specifically, the resistance of the pure GST experiences a sudden drop when the temperature is near 150 Celsius degrees. Since the data bits of each MSB need to be more accurate than the data bits of each LSB, the resistance levels corresponding to different resistance states (e.g., high resistance state (HRS) and low resistance state (LRS)) need to be more distinctive. Therefore, the pure GST can be used to implement one MSB. See FIG. 3A for better explanation, wherein FIG. 3A shows the resistance regions of the pure GST corresponding to different resistance states according to FIG. 2.

Figure 3A:
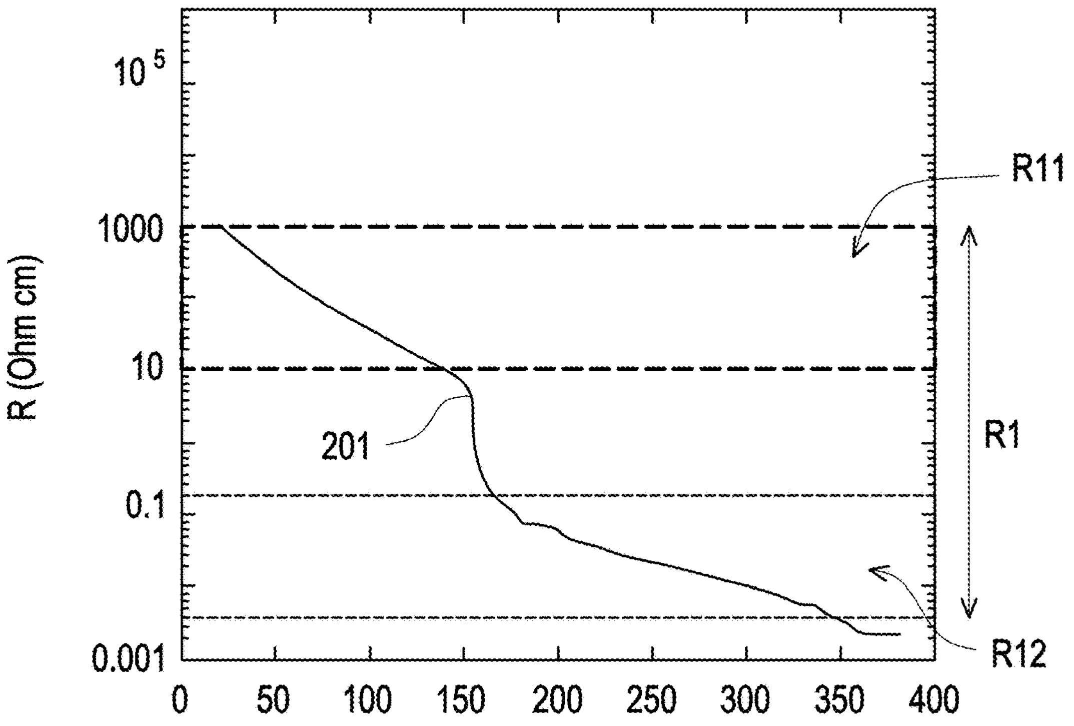
FIG. 3A shows the resistance regions of the pure GST corresponding to different resistance states according to FIG. 2.

In FIG. 3A, the resistance of the pure GST can vary in a resistance range R1 in response to the temperature. In the embodiment, the resistance range R1 can be divided into regions R11 and R12, wherein the regions R11 and R12 can correspond to the HRS (e.g., bit 1) and the LRS (e.g., bit 0), respectively. In this case, when the resistance of the pure GST is within the region R11, the pure GST can be regarded as corresponding to the HRS (e.g., bit 1). On the other hand, when the resistance of the pure GST is within the region R12, the pure GST can be regarded as corresponding to the LRS (e.g., bit 0).

In one embodiment where the pure GST is in HRS, when the pure GST is to be set (i.e., switched from the HRS to the LRS), the temperature of the pure GST can be adjusted to the temperature corresponding to the region R12, such as temperatures over 200 Celsius degrees.

In one embodiment, a plurality of current pulses can be provided/applied to the pure GST to gradually increase the temperature of the pure GST when setting the pure GST, such that the resistance of the pure GST can be gradually decreased. In one embodiment, the current pulses can be continually provided/applied to the pure GST until the resistance thereof is in a target resistance region. For example, when setting the pure GST, current pulses can be continually provided/applied to the pure GST until the resistance is within the region R12.

In one embodiment, when resetting the pure GST (i.e., switching the pure GST from the LRS to the HRS), a current pulse with high current level and short pulse width can be provided/applied to the pure GST, such that the pure GST can be reset to the HRS.

Referring back to the curve 202 in FIG. 2, the resistance variation of the NGST 7 at % is more non-linear than the resistance variations of the NGST 12 at %. More specifically, the resistance of the NGST 7 at % experiences a sudden drop when the temperature is near 200 to 250 Celsius degrees. Therefore, the NGST 7 at % can be also used to implement one MSB. See FIG. 3B for better explanation, wherein FIG. 3B shows the resistance regions of the NGST 7 at % corresponding to different resistance states according to FIG. 2.

Figure 3B:
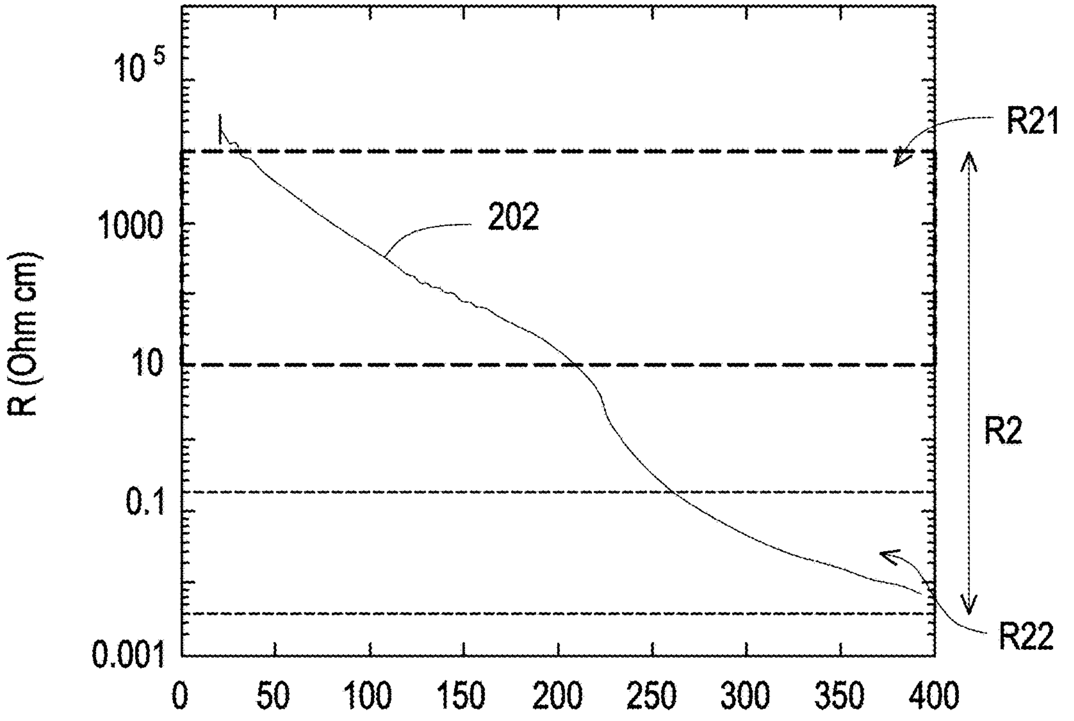
FIG. 3B shows the resistance regions of the NGST 7 at % corresponding to different resistance states according to FIG. 2.

In FIG. 3B, the resistance of the NGST 7 at % can vary in a resistance range R2 in response to the temperature. In the embodiment, the resistance range R2 can be divided into regions R21 and R22, wherein the regions R21 and R22 can correspond to the HRS (e.g., bit 1) and the LRS (e.g., bit 0), respectively. In this case, when the resistance of the NGST 7 at % is within the region R21, the NGST 7 at % can be regarded as corresponding to the HRS (e.g., bit 1). On the other hand, when the resistance of the NGST 7 at % is within the region R22, the NGST 7 at % can be regarded as corresponding to the LRS (e.g., bit 0).

In one embodiment where the NGST 7 at % is in HRS, when the NGST 7 at % is to be set (i.e., switched from the HRS to the LRS), the temperature of the NGST 7 at % can be adjusted to the temperature value corresponding to the region R22, such as temperatures over 250 Celsius degrees.

In one embodiment, a plurality of current pulses can be provided/applied to the NGST 7 at % to gradually increase the temperature of the NGST 7 at % when setting the NGST 7 at %, such that the resistance of the NGST 7 at % can be gradually decreased. In one embodiment, the current pulses can be continually provided/applied to the NGST 7 at % until the resistance thereof is in a target resistance region. For example, when setting the NGST 7 at %, current pulses can be continually provided/applied to the NGST 7 at % until the resistance is within the region R22.

In one embodiment, when resetting the NGST 7 at % (i.e., switching the NGST 7 at % from the LRS to the HRS), a current pulse with high current level and short pulse width can be provided/applied to the NGST 7 at %, such that the NGST 7 at % can be reset to the HRS.

Referring back to the curve 203 in FIG. 2, the resistance variation of the NGST 12 at % is more linear than the resistance variations of the pure GST and the NGST 7 at %. More specifically, the resistance of the NGST 12 at % experiences no sudden drop when the temperature is increasing. Since the data bits of each LSB does not need to be as accurate as the data bits of each MSB, the resistance levels corresponding to different resistance states (e.g., high resistance state (HRS) and low resistance state (LRS)) does not need to be too distinctive. Therefore, the NGST 12 at % can be used to implement at least a part of the LSB part 102*b*. See FIG. 4A for better explanation, wherein FIG. 4A shows the resistance regions of the NGST 12 at % corresponding to different resistance states according to FIG. 2.

Figure 4A:
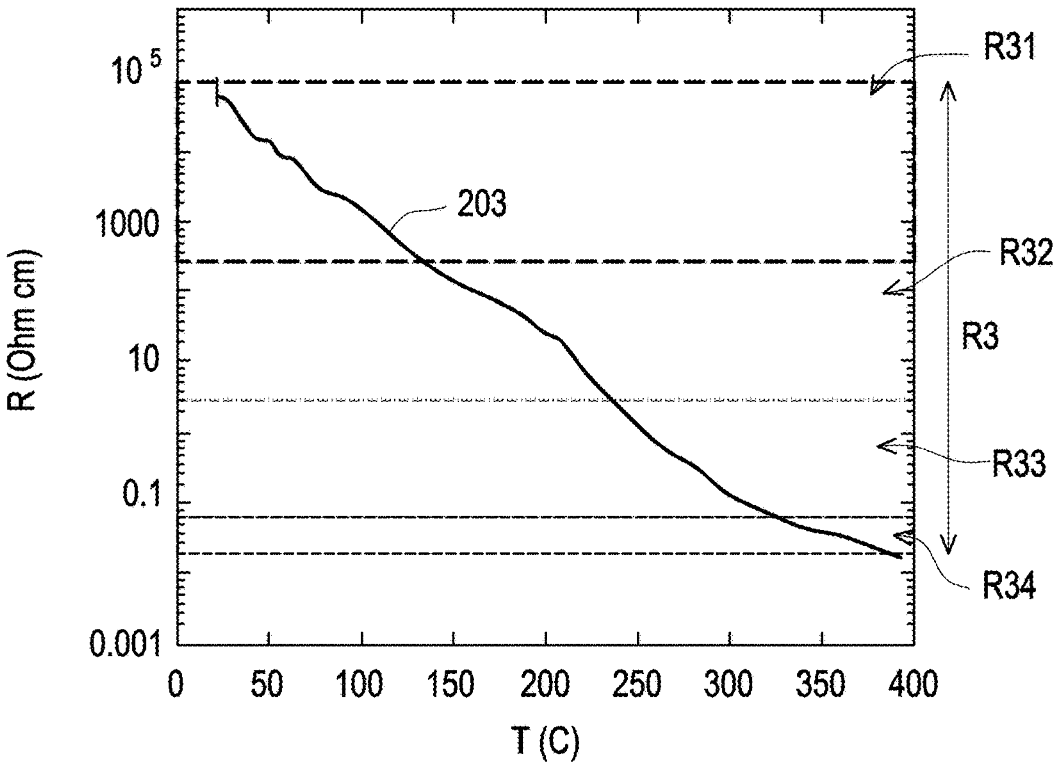
FIG. 4A shows the resistance regions of the NGST 12 at % corresponding to different resistance states according to FIG. 2.

In FIG. 4A, the resistance of the NGST 12 at % can vary in a resistance range R3 in response to the temperature. In the embodiments of the disclosure, the resistance range R3 can be divided based on the number of the first bits (i.e., M bits) characterized by the NGST 12 at %. In one embodiment, the resistance range R3 can be divided into $2^M$ regions. In FIG. 4A, M can be assumed to be 2. In this case, the resistance range R3 can be divided into regions R31, R32, R33, and R34, wherein the regions R31 to R34 can correspond to different combinations of data bits. For example, when the resistance of the NGST 12 at % is within the region R31, the NGST 12 at % can be regarded as corresponding to the data bits "11". When the resistance of the NGST 12 at % is within the region R32, the NGST 12 at % can be regarded as corresponding to the data bits "11". When the resistance of the NGST 12 at % is within the region R33, the NGST 12 at % can be regarded as corresponding to the data bits "01". When the resistance of the NGST 12 at % is within the region R34, the NGST 12 at % can be regarded as corresponding to the data bits "00", but the disclosure is not limited thereto.

In one embodiment, when the NGST 12 at % is to be adjusted to correspond to a specific combination of data bits, the temperature of the NGST 12 at % can be adjusted to the temperature value corresponding to the region corresponding to the specific combination of data bits. For example, in a case where the resistance of the NGST 12 at % is to within the region R31, when the NGST 12 at % is to be set to the combination of data bits corresponding to the region R33, the temperature of the NGST 12 at % can be adjusted to be within the region R33, such that the NGST 12 at % can be set to the combination of data bits corresponding to the region R33, but the disclosure is not limited thereto.

In one embodiment, a plurality of current pulses can be provided/applied to the NGST 12 at % to gradually increase the temperature of the NGST 12 at % for, such that the resistance of the NGST 12 at % can be gradually decreased. In one embodiment, the current pulses can be continually provided/applied to the NGST 12 at % until the resistance thereof is in a target resistance region. For example, in a case where the resistance of the NGST 12 at % is to within the region R31, when the NGST 12 at % is to be set to the combination of data bits corresponding to the region R33, current pulses can be continually provided/applied to the NGST 12 at % until the resistance is within the region R33.

In one embodiment, when resetting the NGST 12 at % (i.e., switching the NGST 12 at % from the LRS to the HRS), a current pulse with high current level and short pulse width can be provided/applied to the NGST 12 at %, such that the NGST 12 at % can be reset to the HRS.

Figure 4B:
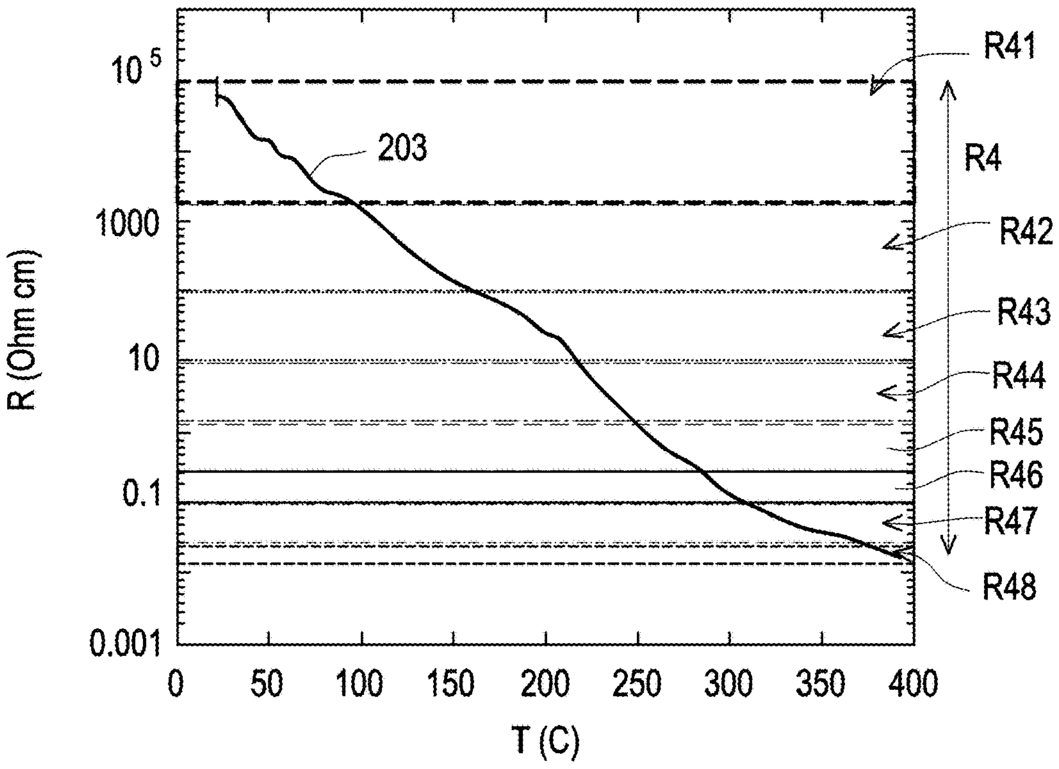
FIG. 4B shows the resistance regions of the NGST 12 at % corresponding to different resistance states according to FIG. 2.

See FIG. 4B for better explanation, wherein FIG. 4B shows the resistance regions of the NGST 12 at % corresponding to different resistance states according to FIG. 2.

In FIG. 4B, the resistance of the NGST 12 at % can vary in a resistance range R4 in response to the temperature. In the embodiments of the disclosure, the resistance range R4 can be divided based on the number of the first bits (i.e., M bits) characterized by the NGST 12 at %. In one embodiment, the resistance range R4 can be divided into $2^M$ regions. In FIG. 4B, M can be assumed to be 3. In this case, the resistance range R4 can be divided into regions R41 to R48, wherein the regions R41 to R44 can correspond to different combinations of data bits. For example, when the resistance of the NGST 12 at % is within the region R41, the NGST 12 at % can be regarded as corresponding to the data bits "111". When the resistance of the NGST 12 at % is within the region R42, the NGST 12 at % can be regarded as corresponding to the data bits "110". When the resistance of the NGST 12 at % is within the region R43, the NGST 12 at % can be regarded as corresponding to the data bits "101". When the resistance of the NGST 12 at % is within the region R44, the NGST 12 at % can be regarded as corresponding to the data bits "100". When the resistance of the NGST 12 at % is within the region R45, the NGST 12 at % can be regarded as corresponding to the data bits "011". When the resistance of the NGST 12 at % is within the region R46, the NGST 12 at % can be regarded as corresponding to the data bits "010". When the resistance of the NGST 12 at % is within the region R47, the NGST 12 at % can be regarded as corresponding to the data bits "001". When the resistance of the NGST 12 at % is within the region R48, the NGST 12 at % can be regarded as corresponding to the data bits "000", but the disclosure is not limited thereto.

In one embodiment, when the NGST 12 at % is to be adjusted to correspond to a specific combination of data bits, the temperature of the NGST 12 at % can be adjusted to the temperature value corresponding to the region corresponding to the specific combination of data bits. For example, in a case where the resistance of the NGST 12 at % is to within the region R41, when the NGST 12 at % is to be set to the combination of data bits corresponding to the region R43, the temperature of the NGST 12 at % can be adjusted to be within the region R43, such that the NGST 12 at % can be set to the combination of data bits corresponding to the region R43, but the disclosure is not limited thereto.

In one embodiment, a plurality of current pulses can be provided/applied to the NGST 12 at % to gradually increase the temperature of the NGST 12 at % for, such that the resistance of the NGST 12 at % can be gradually decreased. In one embodiment, the current pulses can be continually provided/applied to the NGST 12 at % until the resistance thereof is in a target resistance region. For example, in a case where the resistance of the NGST 12 at % is to within the region R41, when the NGST 12 at % is to be set to the combination of data bits corresponding to the region R43, current pulses can be continually provided/applied to the NGST 12 at % until the resistance is within the region R43.

In one embodiment, when resetting the NGST 12 at % (i.e., switching the NGST 12 at % from the LRS to the HRS), a current pulse with high current level and short pulse width can be provided/applied to the NGST 12 at %, such that the NGST 12 at % can be reset to the HRS.

In different embodiments, the configurations of the current pulses can be implemented in various ways.

Figure 5:
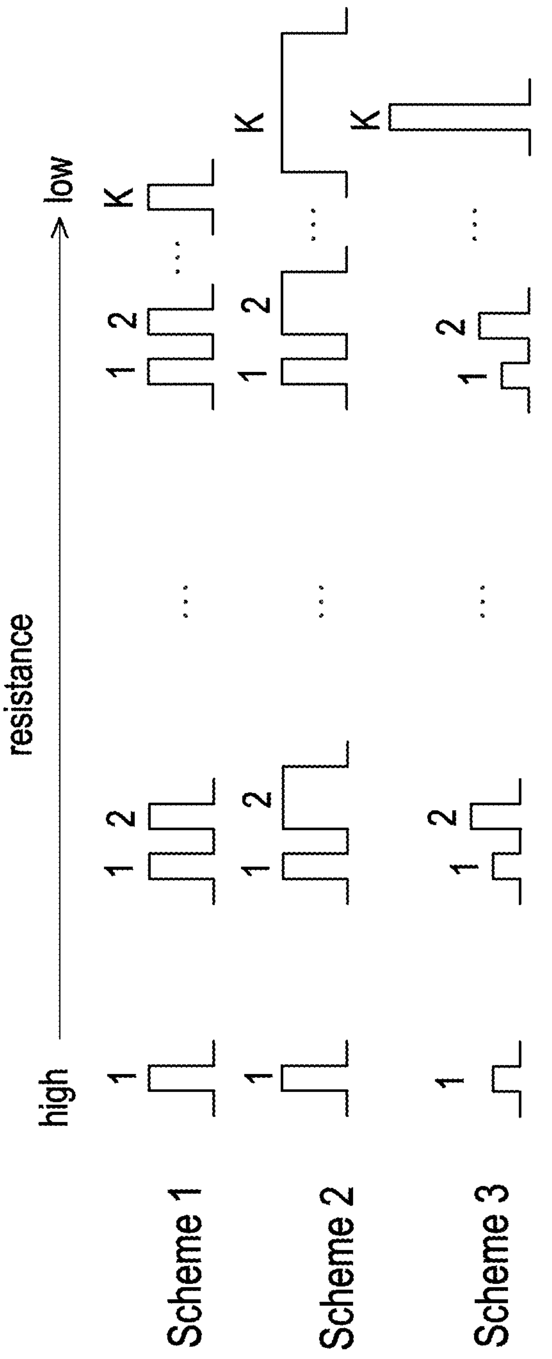
FIG. 5 shows different schemes for implementing the current pulses when setting a PCM cell according to an embodiment of the disclosure.

See FIG. 5, which shows different schemes for implementing the current pulses when setting a PCM cell according to an embodiment of the disclosure. In different embodiments, the PCM cell to be set can be the pure GST, NGST 7 at % or NGST 12 at %, but the disclosure is not limited thereto.

In scheme 1, the pulse widths and the current levels of the current pulses are identical. In scheme 2, the pulse widths of the current pulses can be increasing. That is, a pulse width of an i-th current pulse of the current pulses is wider than a pulse width of an (i−1)-th current pulse of the current pulses, wherein i is an index.

In scheme 3, the pulse widths of the current pulses are identical, but the current levels of the current pulses can be increasing. That is, the current level of the i-th current pulse of the current pulses is higher than a current level of the (i−1)-th current pulse of the current pulses.

In one embodiment, the current level of each current pulse is between 1 μA and 100 μA. In one embodiment, the pulse width of each current pulse is between 50 ns and 10 μs. In one embodiment, a number of the current pulses is between 1 and 100.

In one embodiment, when resetting the PCM cell (i.e., switching the PCM cell back to the HRS), a current pulse with high current level and short pulse width can be provided/applied to the PCM cell, such that the PCM cell can be reset to the HRS. In one embodiment, the current pulse used to reset the PCM cell can be narrower and higher than the current pulses used to set the PCM cell.

Figure 6A:
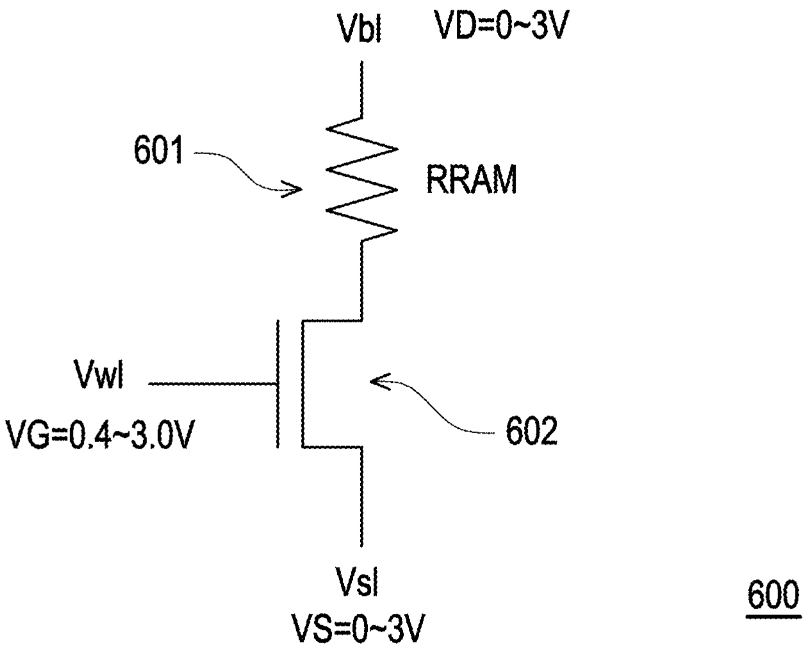
FIG. 6A is a circuit diagram of a RRAM unit according to an embodiment of the disclosure.
Figure 6B:
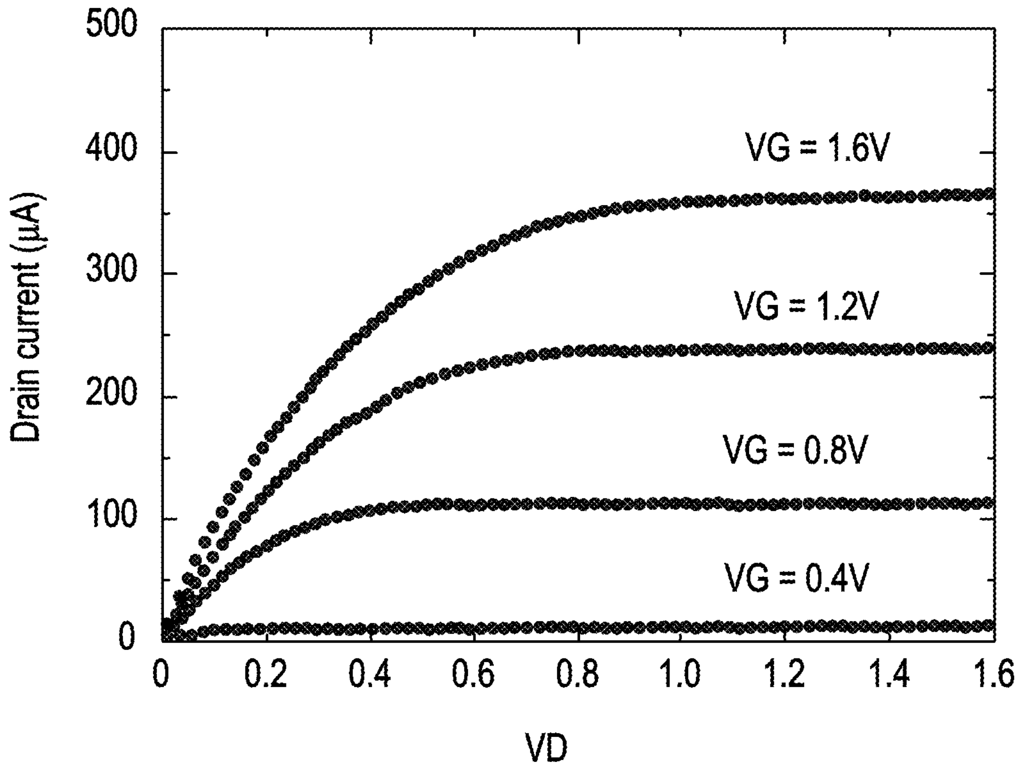
FIG. 6B is an I-V curve of the transistor in the RRAM unit of FIG. 6A.
Figure 6C:
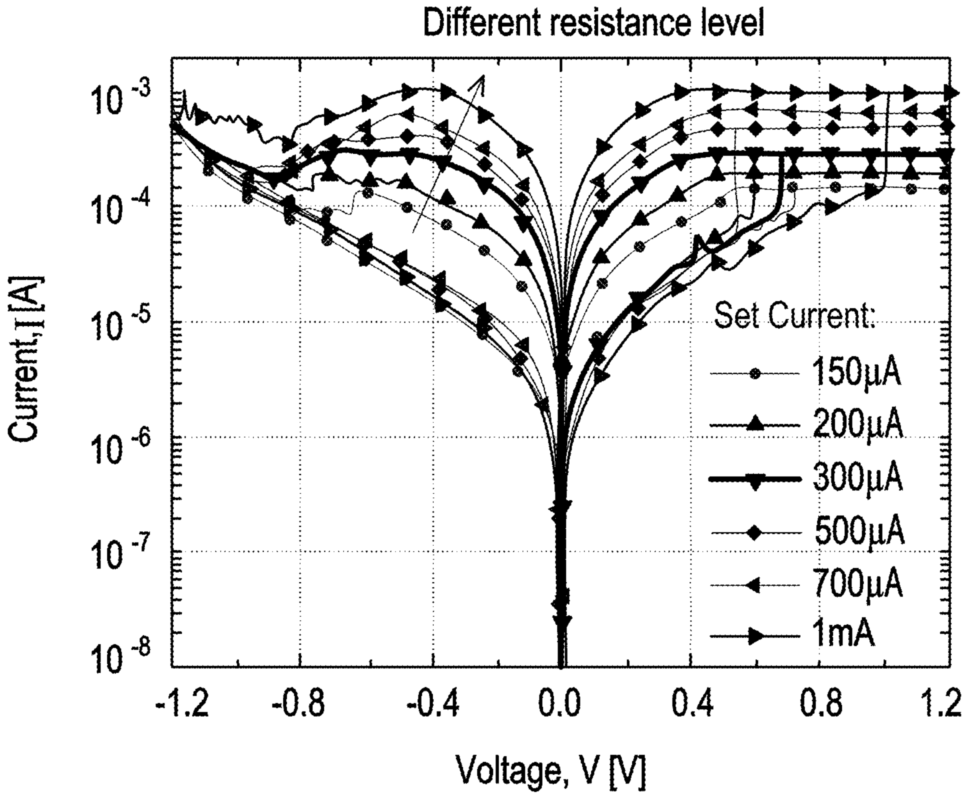
FIG. 6C is a schematic diagram of several I-V curves of the RRAM cell in FIG. 6A.

See FIG. 6A to FIG. 6C, wherein FIG. 6A is a circuit diagram of a RRAM unit according to an embodiment of the disclosure, FIG. 6B is an I-V curve of the transistor in the RRAM unit of FIG. 6A, and FIG. 6C is a schematic diagram of several I-V curves of the RRAM cell in FIG. 6A.

In FIG. 6A, the RRAM unit 600 includes an RRAM cell 601 and a transistor 602, wherein the transistor 602 includes a first terminal, a second terminal, and a control terminal. In the embodiment, the transistor 602 can be a MOSFET, wherein the first terminal can be a drain of the MOSFET, the second terminal can be the source of the MOSFET, and the control terminal can be the gate of the MOSFET.

In the embodiment, the RRAM cell 601 is coupled between a bit line (used to receive a bit line voltage Vbl as the drain voltage VD) and the first terminal of the transistor 602. The control terminal of the transistor 602 is coupled to a word line used to receive a word line voltage Vwl as a gate voltage VG. The second terminal of the transistor 602 is coupled to a source line used to receive a source line voltage Vsl as the source voltage VS.

In FIG. 6B, with a given gate voltage VG, the drain current of the transistor 602 would be limited along with the increasing drain voltage VD. For example, if the gate voltage VG is 0.8V, the drain current of the transistor 602 would be limited to about 100 μA along with the increasing drain voltage VD. For another example, if the gate voltage VG is 1.2V, the drain current of the transistor 602 would be limited to about 210 μA along with the increasing drain voltage VD. Accordingly, the current flowing through the RRAM cell 601 would be also limited as shown in FIG. 6C.

As can be seen on the upper right of FIG. 6C, with a given set current, the current flowing through the RRAM cell 602 would be limited along with the increasing voltage across the RRAM cell 602. In this case, the RRAM cell 601 can be used to characterize one MSB or M bits of LSB.

For example, if the RRAM cell 601 is used to characterize one MSB of the MSB part 102*a*, the current of 150 μA can be used to adjust the RRAM cell 601 to the HRS, and the current of 1 mA can be used to adjust the RRAM cell 601 to the LRS.

For example, if the RRAM cell 601 is used to characterize 2 bits (i.e., M is 2) of the LSB part 102*b*, the current of 200 μA can be used to adjust the RRAM cell 601 to have a resistance corresponding to “11”, the current of 300 μA can be used to adjust the RRAM cell 601 to have a resistance corresponding to “10”, the current of 500 μA can be used to adjust the RRAM cell 601 to have a resistance corresponding to “01”, and the current of 700 μA can be used to adjust the RRAM cell 601 to have a resistance corresponding to “00”, but the disclosure is not limited thereto.

Figure 7:
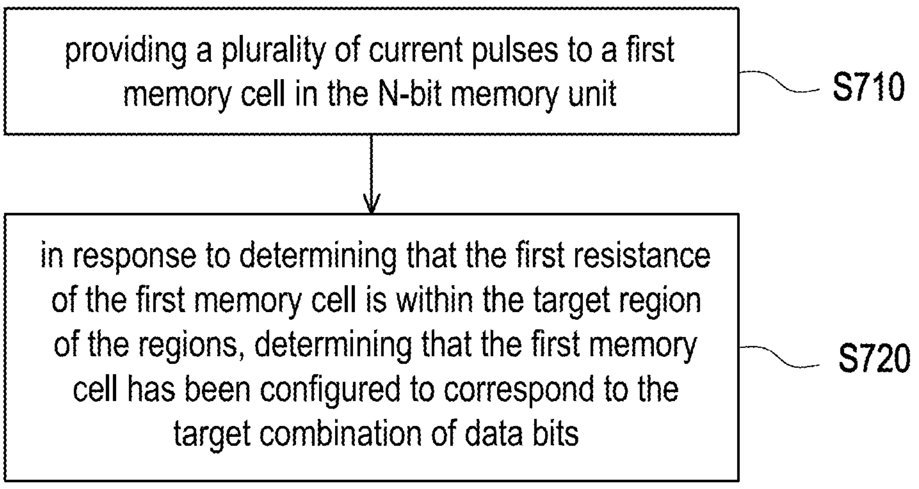
FIG. 7 shows a flow chart of the method for configuring a memory cell in an N-bit memory unit of a memory array according to an embodiment of the disclosure.

See FIG. 7, which shows a flow chart of the method for configuring a memory cell in an N-bit memory unit of a memory array according to an embodiment of the disclosure. The method of this embodiment may be applied to the memory device 100 in FIG. 1, and the details of each step in FIG. 7 will be described below with the components shown in FIG. 1.

In step S710, a plurality of current pulses are provided to the first memory cell C1 in the N-bit memory unit 102, wherein a first resistance of the first memory cell C1 varies in a first resistance range, the first resistance range is divided into a plurality of regions, and each of the regions corresponds to a specific combination of data bits. In the embodiments of the disclosure, the possible configurations of the current pulses provided/applied to the first memory cell C1 can be referred to the discussions of FIG. 5, such as the schemes 1 to 3 in FIG. 5, which would not be repeated herein.

In the embodiments of the disclosure, during providing/applying the current pulses to the first memory cell C1 (e.g., the NGST 12 at %), the temperature of the first memory cell C1 would be gradually increased, such that the first resistance of the first memory cell C1 would be gradually decreased.

For example, if the first memory cell C1 is implemented by using the aforementioned NGST 12 at % and the first memory cell C1 is used to characterize 2 LSB bits in the LSB part 102*b*, the first resistance range can be the resistance range R3 shown in FIG. 4A. In this case, the resistance range R3 can be divided into the regions R31 to R34, wherein the regions R31 to R34 can correspond to the combinations “11”, “10”, “01”, “00”, respectively, but the disclosure is not limited thereto. Accordingly, if the first memory cell C1 is to be set to be corresponding to a target combination of the combinations of data bits, the region corresponding to the target combination can be regarded as the target region.

For example, if the first memory cell C1 is to be set to the target combination of “00”, the corresponding region R34 can be regarded as the target region. In this case, the current pulses can be continually provided/applied to the first memory cell C1 until the first resistance of the first memory cell C1 has been decreased to be within the region R34.

For another example, if the first memory cell C1 is to be set to the target combination of “01”, the corresponding region R33 can be regarded as the target region. In this case, the current pulses can be continually provided/applied to the first memory cell C1 until the first resistance of the first memory cell C1 has been decreased to be within the region R33.

Therefore, during providing/applying the current pulses to the first memory cell C1, whether the first resistance is within the target region can be determined.

In step S720, in response to determining that the first resistance of the first memory cell C1 is within the target region of the regions, it is determined that the first memory cell C1 has been configured to correspond to a target combination of data bits.

On the other hand, in response to determining that the first resistance of the first memory cell C1 is not within the target region of the regions, the current pulses can be continually provided/applied to the first memory cell C1.

In one embodiment, in response to determining that the first resistance is in a specific region lower than the target region, the first memory can be reset to the HRS (e.g., resetting the first resistance to be within the region R31), and the current pulses can be subsequently provided/applied to the first memory cell C1 to gradually decrease the first resistance to be within the target region.

For example, if the first resistance is currently in the region R34, but the first memory cell C1 is needed to be set to "10" (which corresponds to the region R32), the first memory cell C1 can be reset to the HRS by using a specific current pulse with high current level and narrow pulse width, and the current pulses can be subsequently provided/applied to the first memory cell C1 to gradually decrease the first resistance to be within the region R32, but the disclosure is not limited thereto.

In other embodiments, the method of FIG. 7 can be applied to the aforementioned second memory cell (used to characterize other bits in the LSB part 102*b*) to adjust the resistance (which corresponds to the data bits characterized by the second memory cell) the second memory cell, but the disclosure is not limited thereto.

Although the embodiments in the above are introduced with the N-bit memory unit 102 in the memory array 100, other memory units in the memory array 100 can be implemented in ways similar/identical to the above. For example, in other memory units of the memory array 100, each MSB can be implemented by using a pure GST, and multiple LSB bits can be implemented by using a PCM cell with Nitrogen doping (e.g., NGST 12 at %). For another example, in other memory units of the memory array 100, each MSB can be implemented by using an RRAM cell whose resistance can be adjusted by the current of 150 μA or 1 mA, and multiple LSB bits can be implemented by using an RRAM cell whose resistance can be adjusted by the currents of 200 μA, 300 μA, 500 μA, or 700 μA, but the disclosure is not limited thereto.

In accordance with some embodiments, the first memory cell is used to characterize M bits of the LSB part of the N-bit memory unit. In various embodiments, the first memory cell can be implemented as a PCM cell with a specific percentage (e.g., 12%) of Nitrogen doping or an RRAM cell in connection with a transistor. Since the accuracy of the LSB part is less required, the solution provided by the embodiments of the disclosure can be used to achieve high density memory structure in the LSB part of the N-bit memory unit.

In accordance with some embodiments, a memory device is introduced. The memory device includes a memory array, including an N-bit memory unit forming one word in the memory array, wherein N is a positive integer of at least 5, and the N-bit memory unit comprises a least significant bit (LSB) part comprising M LSBs and a most significant bit (MSB) part comprising (N-M) MSB, wherein M is a positive integer of at least 4. The LSB part includes a first memory cell and a second memory cell. The first memory cell is configured to store at least two bits, wherein the first memory cell is configured to store at least two first bits of the M LSBs. The second memory cell is configured to store at least two bits, wherein the second memory cell is configured to store at least two second bits of the M LSBs, wherein the second memory cell is a resistive random-access memory cell. The MSB part includes at least one third memory cell, configured to store only one bit, wherein the at least one third memory cell is configured to store the (N-M) MSB.

In accordance with some embodiments, a memory array is introduced. The memory array includes an N-bit memory unit forming one word in the memory array, wherein N is a positive integer of at least 5, and the N-bit memory unit comprises a least significant bit (LSB) part comprising M LSBs and a most significant bit (MSB) part comprising (N-M) MSB, wherein M is a positive integer of at least 4. The LSB part includes a first memory cell and a second memory cell. The first memory cell is configured to store at least two bits, wherein the first memory cell is configured to store at least two first bits of the M LSBs. The second memory cell is configured to store at least two bits, wherein the second memory cell is configured to store at least two second bits of the M LSBs, wherein the second memory cell is a resistive random-access memory cell. The MSB part includes at least one third memory cell, configured to store only one bit, wherein the at least one third memory cell is configured to store the (N-M) MSB.

In accordance with some embodiments, an N-bit memory unit is introduced. The N-bit memory unit forms one word in a memory array, wherein N is a positive integer of at least 5, and the N-bit memory unit comprises a least significant bit (LSB) part comprising M LSBs and a most significant bit (MSB) part comprising (N-M) MSB, wherein M is a positive integer of at least 4. The LSB part includes a first memory cell and a second memory cell. The first memory cell is configured to store at least two bits, wherein the first memory cell is configured to store at least two first bits of the M LSBs. The second memory cell is configured to store at least two bits, wherein the second memory cell is configured to store at least two second bits of the M LSBs, wherein the second memory cell is a resistive random-access memory cell. The MSB part includes at least one third memory cell, configured to store only one bit, wherein the at least one third memory cell is configured to store the (N-M) MSB.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device, comprising:

a memory array, comprising a memory unit forming one word in the memory array, wherein the memory unit comprises a least significant bit (LSB) part and a most significant bit (MSB) part;

wherein the LSB part comprises:

a first memory cell, configured to store at least two bits of LSBs of the word, wherein the first memory cell is a phase change memory cell including GST with a specific percentage of Nitrogen doping, and wherein the MSB part comprises:

at least one second memory cell, configured to store only one bit of MSB of the word.

2. The memory device according to claim 1, wherein a number of the LSBs of the word is M, and M is a positive integer greater than 1.

3. The memory device according to claim 2, wherein M is at least 4.

4. The memory device according to claim 1, wherein the LSB part further comprises a third memory cell, configured to store at least two other bits of the LSBs, wherein the third memory cell is a resistive random-access memory cell.

5. The memory device according to claim 1, wherein the specific percentage ranges between 7% to 20%.

6. The memory device according to claim 5, wherein the specific percentage ranges between 12% to 15%.

7. The memory device according to claim 1, wherein each second memory cell is a second phase change memory cell, and a material of the second phase change memory cell is GST without Nitrogen doping.

8. The memory device according to claim 2, wherein a first resistance of the first memory cell varies in a first resistance range;

wherein the first resistance range is divided into $2^M$ regions, and each of the regions corresponds to a specific combination of data bits.

9. A memory array, comprising:

a memory unit forming one word in the memory array, wherein the memory unit comprises a least significant bit (LSB) part and a most significant bit (MSB) part;

wherein the LSB part comprises:

a first memory cell, configured to store at least two bits of at least two first bits of LSBs of the word;

a second memory cell, configured to store at least two bits of at least two second bits of the LSBs, wherein the first memory cell is a phase change memory cell including Ge2Sb2Te5 with a first percentage of Nitrogen doping; and wherein the MSB part comprises:

at least one third memory cell, configured to store only one bit of MSB of the word, wherein the third memory cell is a phase change memory cell including Ge2Sb2Te5 with a second percentage of Nitrogen doping.

10. The memory array according to claim 9, wherein a number of the LSBs of the word is M, and M is a positive integer at least 4.

11. The memory array according to claim 9, wherein the first percentage ranges between 7% to 20%.

12. The memory array according to claim 11, wherein the first percentage ranges between 12% to 15%.

13. The memory array according to claim 9, wherein the second percentage of Nitrogen doping is 0.

14. The memory array according to claim 10, wherein a first resistance of the first memory cell varies in a first resistance range;

wherein the first resistance range is divided into $2^M$ regions, and each of the regions corresponds to a specific combination of data bits.

15. A memory unit, wherein the memory unit forms one word in a memory array, the memory unit comprises a least significant bit (LSB) part and a most significant bit (MSB) part;

wherein the LSB part comprises:

a first memory cell, configured to store at least two bits of LSBs of the word, and the first memory cell is a resistive random access memory (RRAM) cell, and wherein the MSB part comprises:

at least one second memory cell, configured to store only one bit of MSB of the word.

16. The memory unit according to claim 15, wherein a number of the LSBs of the word is M, and M is a positive integer greater than 1.

17. The memory unit according to claim 16, wherein M is at least 4.

18. The memory unit according to claim 15, wherein the LSB part further comprises a third memory cell, configured to store at least two other bits of the LSBs.

19. The memory unit according to claim 15, wherein each second memory cell is a phase change memory cell, and a material of the phase change memory cell is GST without Nitrogen doping.

20. The memory unit according to claim 16, wherein a first resistance of the first memory cell varies in a first resistance range;

wherein the first resistance range is divided into $2^M$ regions, and each of the regions corresponds to a specific combination of data bits.

* * * * *